(12) United States Patent
Jung

(10) Patent No.: US 12,219,742 B2
(45) Date of Patent: Feb. 4, 2025

(54) CONVERTER INCLUDING HEAT TRANSFER LAYER

(71) Applicant: LG INNOTEK CO., LTD., Seoul (KR)

(72) Inventor: Jae hoo Jung, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 120 days.

(21) Appl. No.: 17/770,766

(22) PCT Filed: Nov. 13, 2020

(86) PCT No.: PCT/KR2020/016023
§ 371 (c)(1),
(2) Date: Apr. 21, 2022

(87) PCT Pub. No.: WO2021/096305
PCT Pub. Date: May 20, 2021

(65) Prior Publication Data
US 2022/0377931 A1    Nov. 24, 2022

(30) Foreign Application Priority Data
Nov. 13, 2019    (KR) .......................... 10-2019-0145059

(51) Int. Cl.
*H05K 7/20*    (2006.01)
*C09K 5/14*    (2006.01)
(Continued)

(52) U.S. Cl.
CPC .......... *H05K 7/209* (2013.01); *H05K 5/0026* (2013.01); *H05K 5/0217* (2013.01); *H05K 5/03* (2013.01);
(Continued)

(58) Field of Classification Search
CPC ........... H05K 7/20254; H05K 7/20454; H05K 7/20472; H05K 7/20481; H05K 7/20854;
(Continued)

(56) References Cited

U.S. PATENT DOCUMENTS 5,703,752 A    12/1997  Woo
6,376,778 B1 *  4/2002  Huang .................. H05K 3/365
                                                    361/791
(Continued)

FOREIGN PATENT DOCUMENTS

CN          112694       7/1996
CN       102752957 A    10/2012
(Continued)

OTHER PUBLICATIONS

Translation of first office action for CN 202080077184.5.*

*Primary Examiner* — Zachary Pape
(74) *Attorney, Agent, or Firm* — Birch, Stewart, Kolasch & Birch, LLP

(57) ABSTRACT

A converter comprises: a housing comprising a refrigerant flow path; a printed circuit board disposed on top of the housing and on the upper surface of which an electronic component is disposed; and a cover disposed on top of the printed circuit board and which covers the upper surface of the electronic component, wherein a heat transfer layer filled with a thermal interface material is disposed on the upper surface of the housing or the lower surface of the cover overlapping the electronic component in the vertical direction.

12 Claims, 8 Drawing Sheets

(51) Int. Cl.
 *H05K 5/00* (2006.01)
 *H05K 5/02* (2006.01)
 *H05K 5/03* (2006.01)
(52) U.S. Cl.
 CPC ........... *H05K 7/20927* (2013.01); *C09K 5/14* (2013.01); *H05K 7/20454* (2013.01); *H05K 7/20472* (2013.01)
(58) Field of Classification Search
 CPC ............... H05K 7/20872; H05K 7/209; H05K 7/20927; H05K 1/0203; H05K 5/0026; H05K 5/0217; H05K 5/03
 See application file for complete search history.

(56) References Cited

U.S. PATENT DOCUMENTS

| | | |
|---|---|---|
| 2006/0012034 A1 | 1/2006 | Kadoya et al. |
| 2006/0198066 A1* | 9/2006 | Chen ...................... H01H 89/08 361/42 |
| 2010/0254093 A1 | 10/2010 | Oota et al. |
| 2012/0044647 A1* | 2/2012 | Lee ........................ H01G 2/08 361/702 |
| 2017/0142860 A1* | 5/2017 | Takeuchi ................. H05K 5/04 |
| 2017/0182896 A1* | 6/2017 | Masip ................ H05K 7/14322 |

FOREIGN PATENT DOCUMENTS

| | | | | |
|---|---|---|---|---|
| CN | 103296863 | A | | 9/2013 |
| CN | 108432113 | A | | 8/2018 |
| JP | 8-172255 | A | | 7/1996 |
| JP | H09283886 | A | * | 10/1997 |
| JP | 2001-68607 | A | | 3/2001 |
| JP | 2001068607 | | * | 6/2001 |
| JP | 2007-306671 | A | | 11/2007 |
| JP | 2010-103369 | A | | 5/2010 |
| JP | 2010-245174 | A | | 10/2010 |
| JP | 2011-23459 | A | | 2/2011 |
| JP | WO2015/076050 | A1 | | 5/2015 |
| JP | 2017-220568 | A | | 12/2017 |
| JP | 2018014415 | A | * | 1/2018 ............ H01L 23/36 |
| KR | 10-1846204 | B1 | | 4/2018 |
| KR | 10-2019-0052922 | A | | 5/2019 |
| KR | 10-1993807 | B1 | | 6/2019 |
| WO | WO 2015/076050 | A1 | | 5/2015 |
| WO | WO 2017/119261 | A1 | | 7/2017 |
| WO | 2018/174484 | A1 | | 9/2018 |
| WO | WO 2019/139305 | A1 | | 7/2019 |

* cited by examiner

CONVERTER INCLUDING HEAT TRANSFER LAYER

CROSS REFERENCE TO RELATED APPLICATIONS

This application is the National Phase of PCT/KR2020/016023 filed on Nov. 13, 2020, which claims priority under 35 U.S.C. § 119 (a) to Patent Application No. 10-2019-0145059 filed in the Republic of Korea on Nov. 13, 2019, all of which are hereby expressly incorporated by reference into the present application.

TECHNICAL FIELD

The present invention relates to a converter.

BACKGROUND ART

The content described below provides background information on the present embodiment and does not describe the prior art.

As electric devices of automobiles, engine electric devices (starting device, ignition device, and charging device) and lighting device are common, but in recent years, as vehicles are more electronically controlled, most systems including chassis electric devices are becoming electric and electronic.

Various electric components such as lamps, audio, heaters, and air conditioners installed in automobiles receive power from the battery when the car is stopped and receive power from the generator when driving, and at this time, the power generation capacity of the 14V power system is used as a normal power supply voltage.

Recently, along with the development of the information technology industry, various new technologies (motorized power steering, Internet, and the like) for the purpose of increasing the convenience of automobiles are being adopted to vehicles, and in the future, it is expected that the development of new technologies that can utilize the current automobile system to the maximum will continue.

A hybrid electric vehicle (HEV), regardless of soft or hard type, is equipped with a DC-DC converter for supplying an electric load (12V). In addition, the DC-DC converter, which acts as a generator (alternator) of a general gasoline vehicle, supplies a voltage of 12V for the electric load by reducing the high voltage of the main battery (usually a high-voltage battery of 144V or more).

A DC-DC converter refers to an electronic circuit device that converts DC power of a certain voltage to DC power of another voltage, and is used in various fields such as television sets and automobile electronic products.

The outer appearance of a converter may be formed by the housing, and a plurality of electronic components for driving are disposed inside the housing. The plurality of electronic components generates heat by driving. For heat dissipation, a refrigerant pipe or a refrigerant passage for absorbing heat generated from the electronic component is disposed in the housing, but here is a problem in that heat dissipation within the housing is not sufficiently achieved with only the refrigerant pipe.

DETAILED DESCRIPTION OF THE INVENTION

Technical Subject

An object of the present embodiment is to provide a converter capable of enhancing the heat dissipation efficiency by improving the structure.

Technical Solution

In one embodiment, a converter comprises: a housing including a refrigerant flow path; a printed circuit board being disposed on an upper portion of the housing, and being disposed with electronic components on an upper surface thereof; and a cover being disposed on an upper portion of the printed circuit board and covering an upper surface of the electronic components, wherein a heat transfer layer filled with a thermal interface material is disposed on an upper surface of the housing or a lower surface of the cover being overlapped with the electronic components in up and down directions.

A groove for accommodating the heat transfer layer may be formed on an upper surface of the housing and a lower surface of the cover.

A protruded part being protruded upward more than other regions is disposed on an upper surface of the housing, wherein the protruded part is being disposed to be overlapped with the electronic components in up and down directions, and wherein the heat transfer layer may be disposed on an upper surface of the protruded part.

The electronic components include a terminal, and the terminal may be protruded downward penetrating through the printed circuit board.

A terminal groove to which the terminal is coupled may be disposed on an upper surface of the housing, and the heat transfer layer may be disposed inside the terminal groove.

The electronic components may include an inductor and a transformer.

The heat transfer layer may include a first heat transfer layer disposed at a lower portion of the printed circuit board and a second heat transfer layer disposed between the cover and the electronic components.

A bracket surrounding an outer surface of the transformer is included, and both ends of the bracket may be coupled to the printed circuit board.

The terminal groove may be disposed adjacent to the protruded part.

In another embodiment, a converter comprises: a housing; a printed circuit board being disposed on one surface of the housing; electronic components being electrically connected to the printed circuit board and including a terminal; and a cover being disposed on an upper portion of the printed circuit board, wherein a terminal groove for accommodating at least a portion of the terminal is disposed in the housing or the cover, and wherein a heat transfer layer filled with a thermal interface material is disposed in the terminal groove.

Advantageous Effects

According to the present invention, there is an advantage that heat dissipation efficiency can be enhanced by forming a heat transfer layer to transfer heat in both directions based on electronic components.

In addition, since the heat transfer layer is formed with a region coated with a thermal interface material, there is an advantage that the contact area with electronic components can be increased.

BEST MODE

Hereinafter, preferred embodiments of the present invention will be described in detail with reference to the accompanying drawings.

However, the technical idea of the present invention is not limited to some embodiments to be described, but may be implemented in various forms, and within the scope of the technical idea of the present invention, one or more of the constituent elements may be selectively combined or substituted between embodiments.

In addition, the terms (including technical and scientific terms) used in the embodiments of the present invention, unless explicitly defined and described, can be interpreted as a meaning that can be generally understood by a person skilled in the art, and commonly used terms such as terms defined in the dictionary may be interpreted in consideration of the meaning of the context of the related technology.

In addition, terms used in the present specification are for describing embodiments and are not intended to limit the present invention.

In the present specification, the singular form may include the plural form unless specifically stated in the phrase, and when described as "at least one (or more than one) of A and B and C", it may include one or more of all combinations that can be combined with A, B, and C.

In addition, in describing the components of the embodiment of the present invention, terms such as first, second, A, B, (a), and (b) may be used. These terms are merely intended to distinguish the components from other components, and the terms do not limit the nature, order or sequence of the components.

And, when a component is described as being 'connected', 'coupled' or 'interconnected' to another component, the component is not only directly connected, coupled or interconnected to the other component, but may also include cases of being 'connected', 'coupled', or 'interconnected' due that another component between that other components.

In addition, when described as being formed or arranged in "on (above)" or "below (under)" of each component, "on (above)" or "below (under)" means that it includes not only the case where the two components are directly in contact with, but also the case where one or more other components are formed or arranged between the two components. In addition, when expressed as "on (above)" or "below (under) ", the meaning of not only an upward direction but also a downward direction based on one component may be included.

A converter according to the present embodiment is an electronic device provided in an automobile, and refers to an electronic circuit device that converts power of a certain voltage to power of another voltage. For example, the converter may be a DC-DC converter. However, the configuration according to the present embodiment is not limited thereto, and the connector module according to the present embodiment may be applied to various electronic devices.

Figure 1:
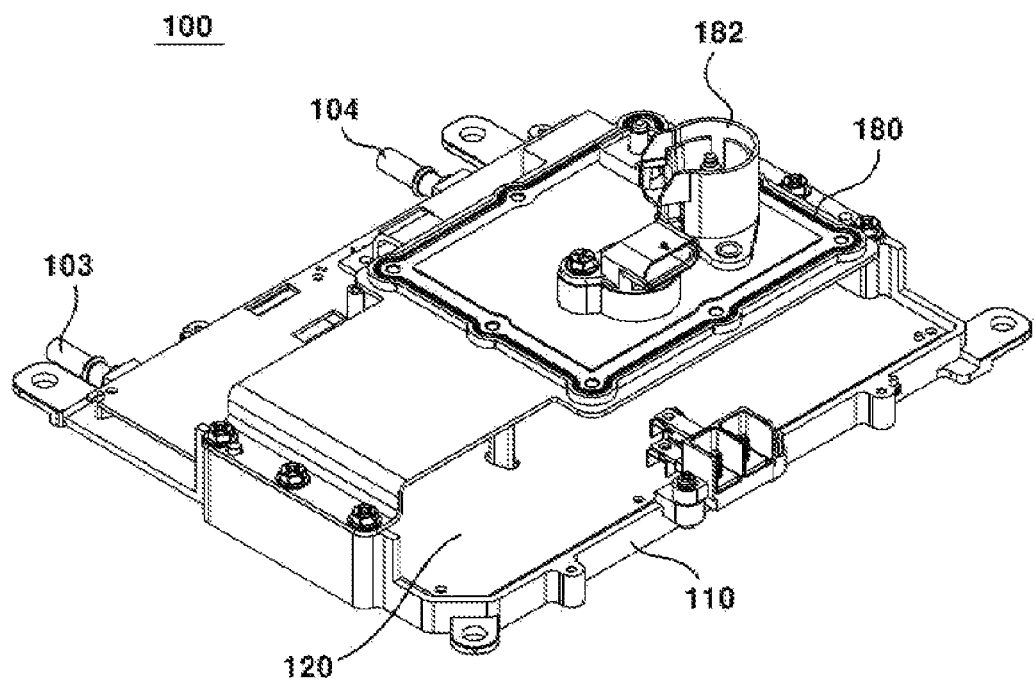
FIG. 1 is a perspective view of a converter according to an embodiment of the present invention.
Figure 2:
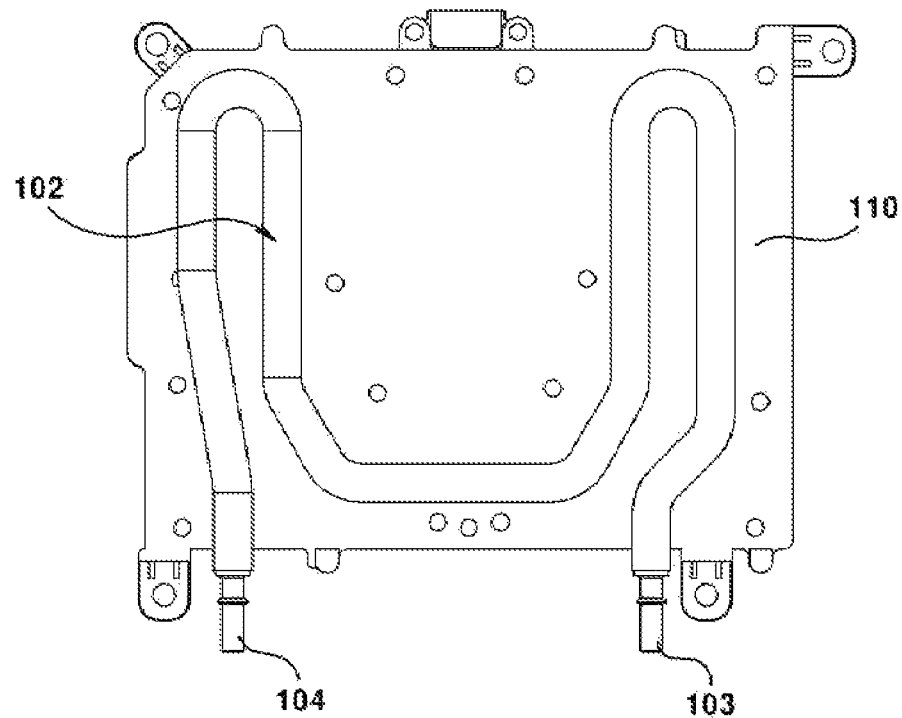
FIG. 2 is a plan view illustrating a lower surface of the converter according to an embodiment of the present invention.
Figure 3:
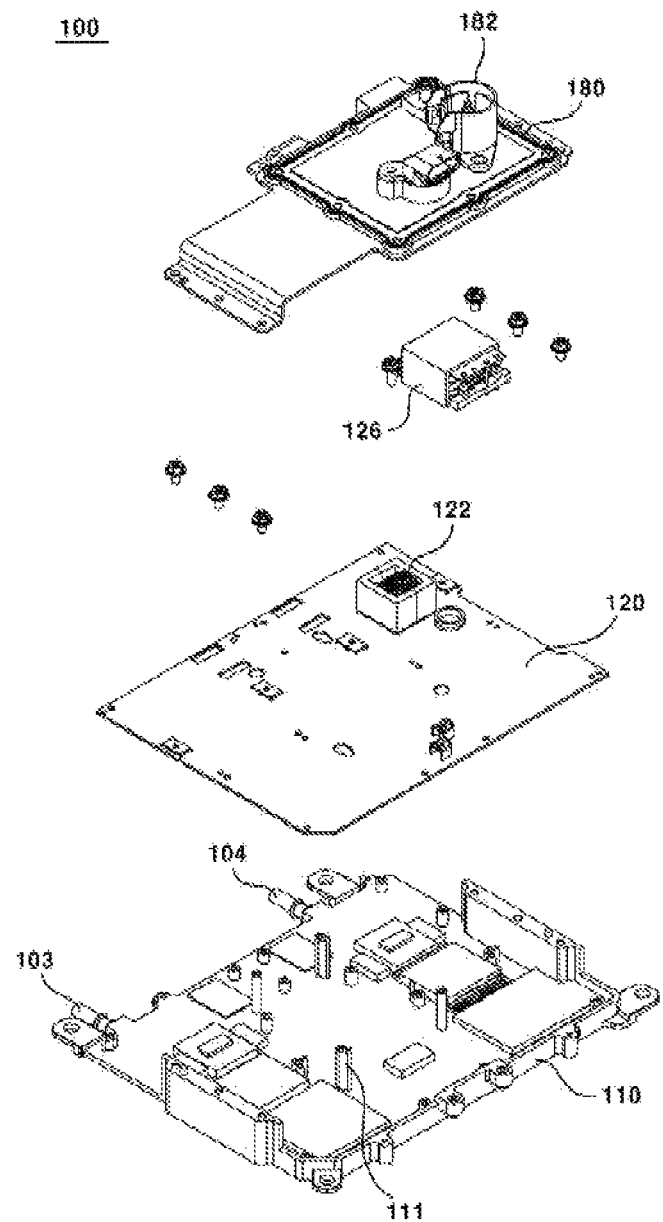
FIG. 3 is an exploded perspective view of a converter according to an embodiment of the present invention.
Figure 4:
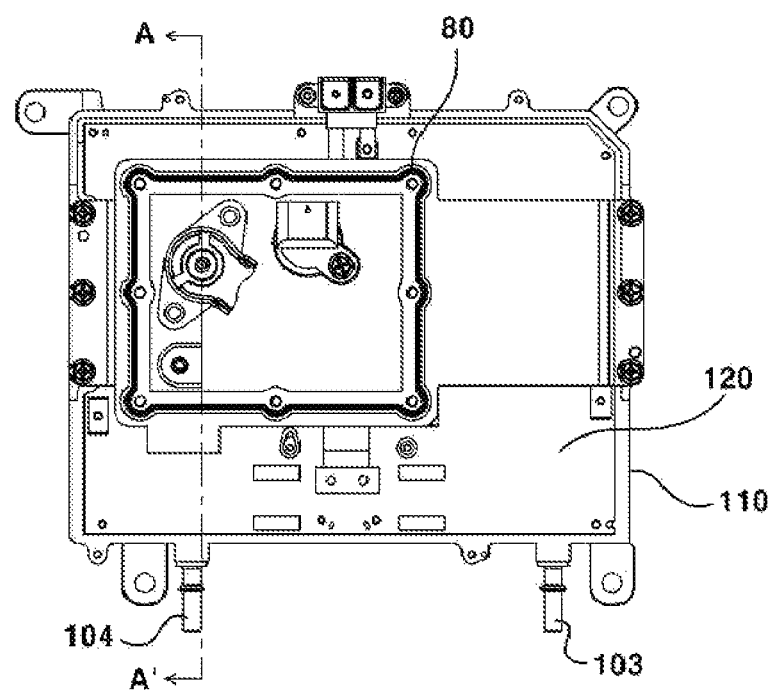
FIG. 4 is a plan view illustrating an upper surface of a converter according to an embodiment of the present invention.
Figure 5:
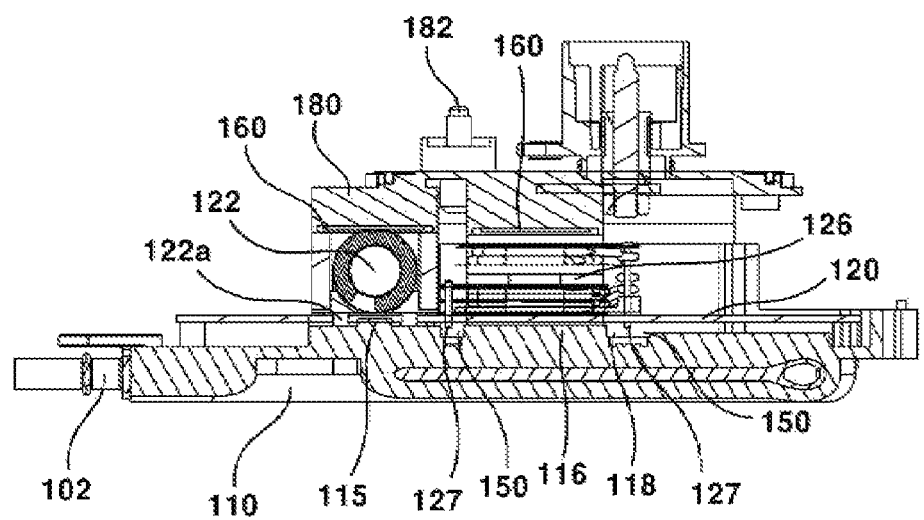
FIG. 5 is a cross-sectional view taken along line A-A' of FIG. 4.
Figure 6:
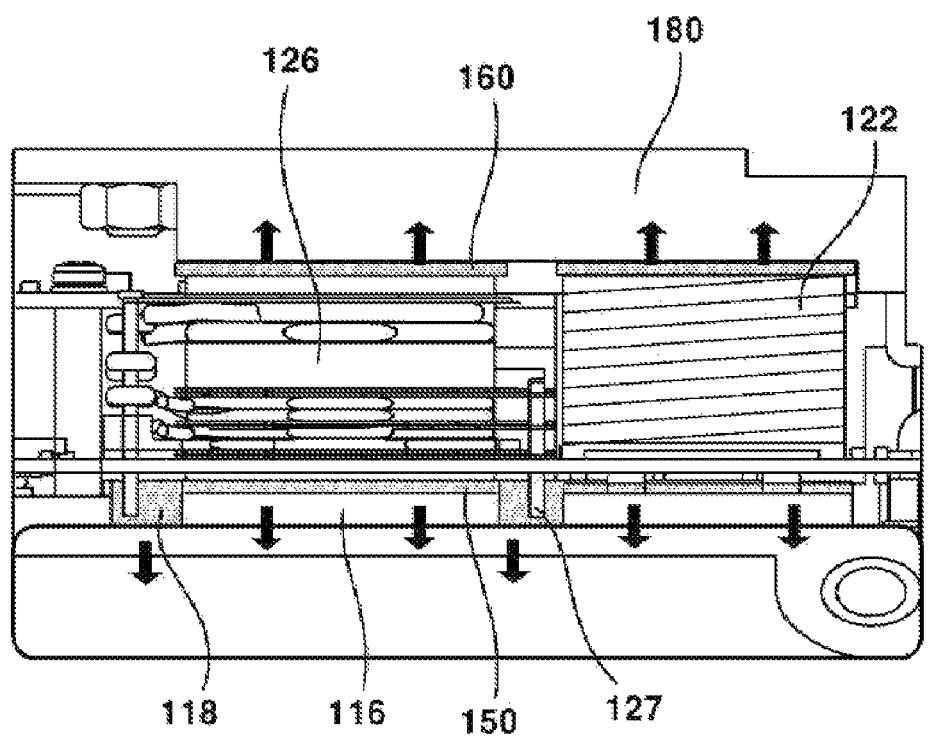
FIG. 6 is a cross-sectional view of a converter according to an embodiment of the present invention.
Figure 7:
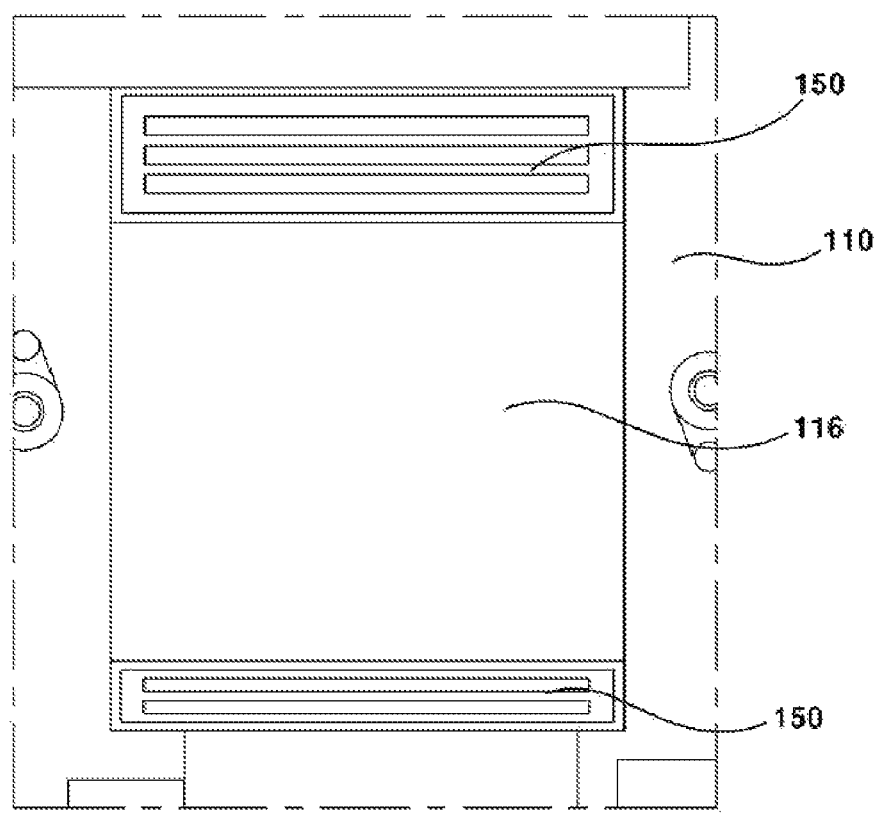
FIG. 7 is a plan view illustrating a lower surface of the cover according to the embodiment of the present invention.
Figure 8:
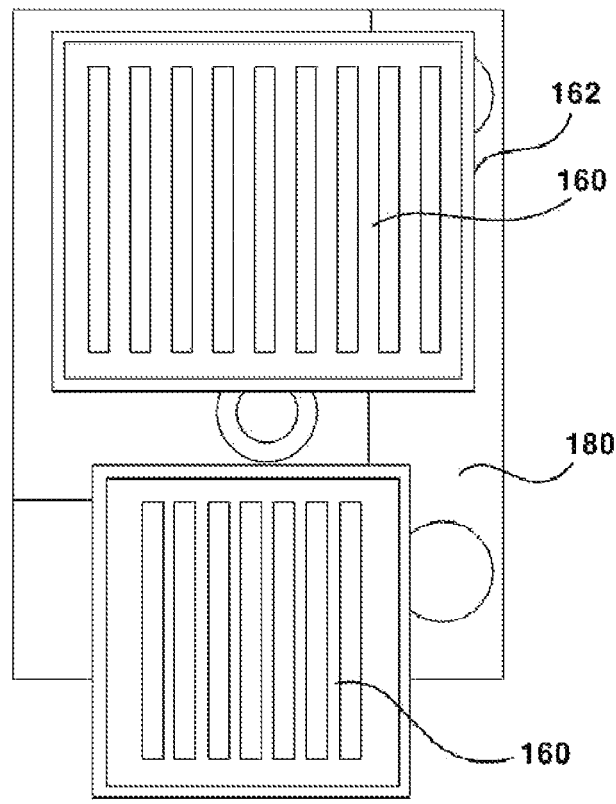
FIG. 8 is a plan view illustrating an upper surface of a housing according to an embodiment of the present invention.
Figure 9:
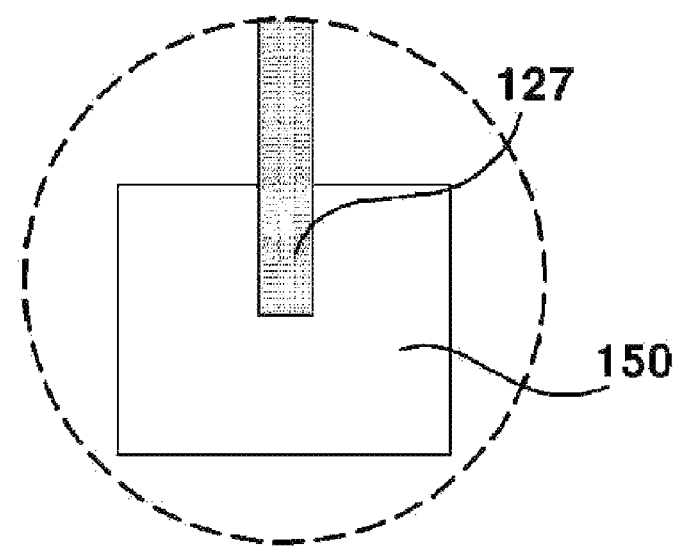
FIG. 9 is a cross-sectional view illustrating the arrangement of a terminal in a terminal groove according to an embodiment of the present invention.
Figure 10:
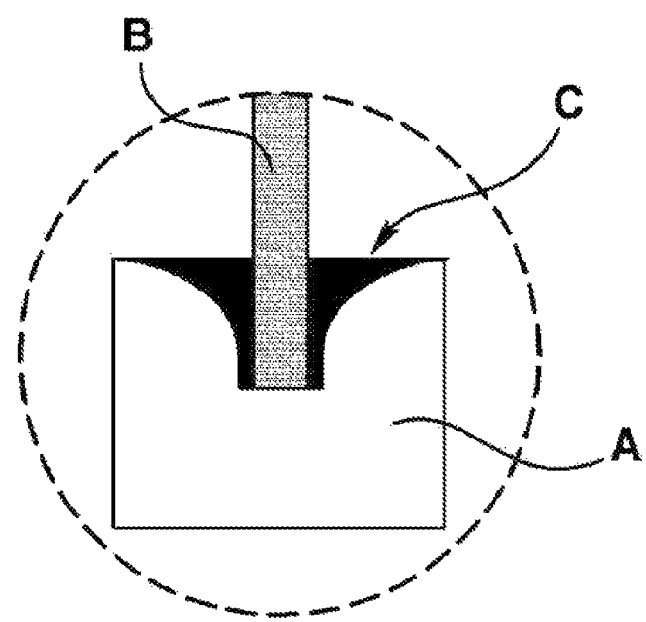
FIG. 10 is a cross-sectional view illustrating a comparative example when a general heat dissipation pad is disposed in a terminal groove.

FIG. 1 is a perspective view of a converter according to an embodiment of the present invention; FIG. 2 is a plan view illustrating a lower surface of the converter according to an embodiment of the present invention; FIG. 3 is an exploded perspective view of a converter according to an embodiment of the present invention; FIG. 4 is a plan view illustrating an upper surface of a converter according to an embodiment of the present invention; FIG. 5 is a cross-sectional view taken along line A-A' of FIG. 4; FIG. 6 is a cross-sectional view of a converter according to an embodiment of the present invention; FIG. 7 is a plan view illustrating a lower surface of the cover according to the embodiment of the present invention; FIG. 8 is a plan view illustrating an upper surface of a housing according to an embodiment of the present invention; FIG. 9 is a cross-sectional view illustrating the arrangement of a terminal in a terminal groove according to an embodiment of the present invention; and FIG. 10 is a cross-sectional view illustrating a comparative example when a general heat dissipation pad is disposed in a terminal groove.

Referring to FIGS. 1 to 10, a converter 100 according to an embodiment of the present invention may comprise: a housing 110, a printed circuit board 120 being disposed in the housing 110; and a cover 180 being disposed printed circuit board 120.

The housing 110 is formed in a plate shape, and a plurality of electronic components including the printed circuit board 120 may be disposed on an upper portion thereof. The housing 110 may be referred to as a base in that it supports the printed circuit board and the electronic components at a lower portion. A printed circuit board other than the printed circuit board 120 may be disposed on an upper surface of the housing 110. The other printed circuit board may be spaced apart from the printed circuit board 120 in up and down directions, and may be electrically connected to each other.

A support part 111 for separating the printed circuit board 120 upward may be disposed on an upper surface of the housing 110. One end of the support part 111 is coupled to an upper surface of the housing 110, and the other end may be coupled to a lower surface of the printed circuit board 120.

Inside the housing 110, an inlet 104 through which refrigerant is being introduced in is disposed at one end, and a refrigerant flow path 102 being formed with a discharge outlet 103 through which refrigerant is being discharged may be disposed at the other end. Accordingly, the refrigerant introduced through the inlet 104 is circulated through the refrigerant flow path 102 to exchange heat, and then may be discharged through the discharge outlet 103.

Unlike this, by coupling a refrigerant pipe through which refrigerant flows to a lower surface of the housing 110, heat generated in the housing 110 can be radiated through the refrigerant pipe.

The printed circuit board 120 may be formed in a plate shape and disposed on an upper portion of the housing 110. A plurality of electronic components for driving the converter 100 may be disposed on the printed circuit board 120. For example, a transformer 126 for voltage regulation and an inductor 122 for obtaining inductance may be disposed on an upper surface of the printed circuit board 120. The transformer 126 and the inductor 122 are electrically connected to the printed circuit board 120 and may be disposed to be spaced apart from each other.

The transformer 126 may include a first terminal 127 to be electrically connected to the printed circuit board 120. The first terminal 127 may include an input terminal and an output terminal. The first terminal 127 may penetrate through the printed circuit board 120, and at least a portion may be disposed to be protruded downward from a lower surface of the printed circuit board 120.

Meanwhile, the transformer 126 may be coupled to the printed circuit board 120 through a bracket. The bracket may be disposed to surround the outer surface of the transformer 126 so that a lower end thereof may be physically coupled to an upper surface of the printed circuit board 120 or the housing 110.

The inductor 122 may include a second terminal 122a to be electrically connected to the printed circuit board 120. The second terminal 122a may include an input terminal and an output terminal. The second terminal 122a penetrates through the printed circuit board 120 so that at least a portion thereof may be disposed to be protruded downward from a lower surface of the printed circuit board 120.

The transformer 126 and the inductor 122 may be disposed to be overlapped with the refrigerant flow path 102 in up and down directions.

The cover 180 may be disposed on an upper portion of the printed circuit board 120. The cover 180 may be disposed on an upper portion of the electronic components to cover the electronic components. The cover 180 may be screw-coupled to the printed circuit board 120. A connector 182 for coupling with an external terminal may be disposed on an upper surface of the cover 180.

The housing 110 and the cover 180 may be formed of a metal material. For example, the material of the housing 110 and the cover 180 may be aluminum.

The converter 100 may further include a case for protecting the housing 110, the printed circuit board 120, and the cover 180 from an external area. A space in which the housing 110, the printed circuit board 120, and the cover 180 are accommodated may be formed inside the case.

Hereinafter, the heat dissipation structure of the converter 100 according to the present embodiment will be described.

A first protruded part 115 and a second protruded part 116 that is being protruded further upward than other regions may be disposed on an upper surface of the housing 110. The first protruded part 115 may be disposed in a region being overlapped with the inductor 122 in up and down directions. The second protruded part 116 may be disposed in a region being overlapped with the transformer 126 in up and down directions.

An upper surface of the first protruded part 115 and an upper surface of the second protruded part 116 may be formed to have a height lower than an upper surface of the housing 110. An upper surface of the first protruded part 115 and an upper surface of the second protruded part 116 may be formed to have a step on the upper surface of the housing 110. Accordingly, a region being overlapped with the inductor 122 or the transformer 126 in the up and down directions among the upper surface of the housing 110 may be formed to have a step formed to be further downward than the other region.

In addition, on an upper surface of the housing 110, a terminal groove 118 being formed to be further recessed than the other regions so that the first terminal 127 or the second terminal 122a is being disposed therein may be disposed. The terminal groove 118 may be disposed adjacent to the first protruded part 115 or the second protruded part 116. The terminal groove 118 may be disposed between the first protruded part 115 and the second protruded part 116. For example, when the first terminal 127 is disposed inside the terminal groove 118, the terminal groove 118 may be disposed at both sides of the second protruded part 116, respectively. The bottom surface of the terminal groove 118 may be an upper surface of the housing 110.

The printed circuit board 120 and the upper surface of the housing 110, and the cover 120 and the upper surface of the electronic components may be spaced apart from each other by a predetermined distance. A gap may be formed between the printed circuit board 120 and the upper surface of the housing 110 and between the cover 120 and the upper surface of the electronic components. A heat transfer layer 150 may be disposed in the gap. The heat transfer layer 150 may be a region filled with a thermal interface material. The heat transfer layer 150 may be formed by coating and curing the thermal interface material on the housing 110. For example, the heat transfer layer 150 may be a region to which thermal grease is applied.

In other words, a groove may be formed in an upper surface of the housing 110 or a lower surface of the cover 180 to accommodate the heat transfer layers 150 and 160.

The heat transfer layer 150 may have a lower surface disposed on an upper surface of the housing 110, and an upper surface may be disposed on a lower surface of the printed circuit board 120. Unlike this, an upper surface of the heat transfer layer 150 may be spaced apart from a lower surface of the printed circuit board 120 by a predetermined distance. The heat transfer layer 150 may transfer heat generated from the electronic components to the refrigerant flow path 102 through the housing 110.

In more detail, the heat transfer layer 150 may be disposed on the terminal groove 118 and upper surfaces of the protruded parts 115 and 116. The heat transfer layer 150 may be disposed in an area being overlapped with the electronic components in up and down directions. The heat transfer layer 150 inside the terminal groove 118 is filled so that the terminals 122a and 127 may be coupled to the heat transfer layer 150. The terminals 122a and 127 can be fitted into the heat transfer layer 150.

Therefore, as shown in FIG. 9, at least a portion of the outer surfaces of the terminals 122a and 127 may be covered by the heat transfer layer 150. As shown in FIG. 10, when the heat transfer layer 150 is implemented as a separate heat dissipation pad A rather than the application area of the heat dissipation material, since a gap C is formed between the heat dissipation pad A and the terminal B in the process of inserting the terminal B, there is a concern that the heat transfer to the heat dissipation pad A through the terminal B may not be performed smoothly.

However, according to this embodiment, by inserting the terminal 127 after filling the thermal interface material inside the terminal groove 118, it is possible to prevent a gap from being generated between the terminal and the heat transfer layer 150, heat transfer can be performed more smoothly.

A heat transfer layer 160 filled with a thermal interface material may also be disposed on a region facing the electronic components of the lower surface of the cover 180. The heat transfer layer 160 may be disposed between an upper surface of the electronic components and a lower surface of the cover 180. Accordingly, heat generated from the electronic components may be transferred to the cover 180 through the heat transfer layer 160.

Meanwhile, on a lower surface of the cover 180, a heat transfer layer accommodating part 162 for arranging the heat transfer layer 160 may be disposed. A groove may be formed inside the heat transfer layer accommodating part 162 so that the heat transfer layer 160 is disposed. A cross-sectional shape of the groove may correspond to a cross-sectional shape of an upper surface of the electronic components.

In summary, the heat transfer layer may include: a first heat transfer layer 150 disposed between the printed circuit board 120 and an upper surface of the housing 110; and a second heat transfer layer 160 disposed between the electronic components and a lower surface of the cover 180.

According to the above-described structure, there is an advantage in that heat dissipation efficiency can be enhanced by forming a heat transfer layer so that heat is transferred in both directions with respect to the electronic components.

In addition, since the heat transfer layer is formed with a region coated with a thermal interface material, there is an advantage that the contact area with electronic components can be increased.

In the above description, it is described that all the components constituting the embodiments of the present invention are combined or operated in one, but the present invention is not necessarily limited to these embodiments. In other words, within the scope of the present invention, all of the components may be selectively operated in combination with one or more. In addition, the terms "comprise", "include" or "having" described above mean that the corresponding component may be inherent unless specifically stated otherwise, and thus it should be construed that it does not exclude other components, but further include other components instead. All terms, including technical and scientific terms, have the same meaning as commonly understood by one of ordinary skill in the art unless otherwise defined. Terms used generally, such as terms defined in a dictionary, should be interpreted to coincide with the contextual meaning of the related art, and shall not be interpreted in an ideal or excessively formal sense unless explicitly defined in the present invention.

The above description is merely illustrative of the technical idea of the present invention, and those skilled in the art to which the present invention pertains may make various modifications and changes without departing from the essential characteristics of the present invention. Therefore, the embodiments disclosed in the present invention are not intended to limit the technical idea of the present invention but to describe the present invention, and the scope of the technical idea of the present invention is not limited by these embodiments. The protection scope of the present invention should be interpreted by the following claims, and all technical ideas within the equivalent scope should be interpreted as being included in the scope of the present invention.

The invention claimed is:

1. A converter comprising:
   a housing including a refrigerant flow path;
   a printed circuit board being disposed on an upper portion of the housing, and being disposed with electronic components on an upper surface thereof; and
   a cover being disposed on an upper portion of the printed circuit board and covering an upper surface of the electronic components,
   wherein a heat transfer layer filled with a thermal interface material is disposed on an upper surface of the housing or a lower surface of the cover being overlapped with the electronic components in up and down directions,
   wherein a groove for accommodating the heat transfer layer is formed on the upper surface of the housing or the lower surface of the cover,
   wherein a protruded part being protruded upward more than other regions is disposed on the upper surface of the housing,
   wherein the protruded part is being disposed to be overlapped with the electronic components in the up and down directions,
   wherein the heat transfer layer is disposed on an upper surface of the protruded part,
   wherein the heat transfer layer is an area where thermal grease is applied,
   wherein the electronic components include a terminal,
   wherein the terminal is protruded downward penetrating through the printed circuit board,
   wherein at least a portion of the terminal is disposed in the groove,
   wherein a terminal groove to which the terminal is coupled is disposed on the upper surface of the housing,
   wherein the heat transfer layer is disposed inside the terminal groove,
   wherein the terminal groove is provided in plurality,
   wherein the plurality of terminal grooves are respectively disposed on both sides of the protruded part,
   wherein a first direction length of the heat transfer layer disposed in the terminal groove is longer than the first direction length of the heat transfer layer disposed on the protruded part, and
   wherein the terminal overlaps the protruded part in a second direction perpendicular to the first direction.

2. The converter according to claim 1, wherein the electronic components include an inductor and a transformer.

3. The converter according to claim 2, wherein the refrigerant flow path is disposed to overlap the inductor and the transformer.

4. The converter according to claim 1, wherein the heat transfer layer includes a first heat transfer layer disposed at a lower portion of the printed circuit board and a second heat transfer layer disposed between the cover and the electronic components.

5. The converter according to claim 1, wherein the terminal groove is being disposed adjacent to the protruded part.

6. The converter according to claim 1, wherein a lower surface of the printed circuit board, the upper surface of the housing, the upper surface of the printed circuit board, and the lower surface of the cover are spaced apart from each other.

7. The converter according to claim 1, wherein the cover is screwed to the printed circuit board.

8. The converter according to claim 1, wherein a support part is disposed between the housing and the printed circuit board, and separates the printed circuit board from the housing.

9. The converter according to claim 1, wherein an upper surface of the heat transfer layer is spaced apart from a lower surface of the printed circuit board.

10. A converter comprising:
a housing;
a printed circuit board being disposed on one surface of the housing;
electronic components being electrically connected to the printed circuit board and including a terminal; and
a cover being disposed on an upper portion of the printed circuit board,
wherein a terminal groove for accommodating at least a portion of the terminal is disposed in the housing or the cover,
wherein a heat transfer layer filled with a thermal interface material is disposed in the terminal groove,
wherein a protruded part being protruded upward more than other regions is disposed on an upper surface of the housing,
wherein the protruded part is being disposed to be overlapped with the electronic components in up and down directions,
wherein the heat transfer layer is disposed on an upper surface of the protruded part,
wherein the terminal is protruded downward penetrating through the printed circuit board,
wherein the terminal groove is provided in plurality,
wherein the plurality of terminal grooves are respectively disposed on both sides of the protruded part,
wherein a first direction length of the heat transfer layer disposed in the terminal groove is longer than the first direction length of the heat transfer layer disposed on the protruded part, and
wherein the terminal overlaps the protruded part in a second direction perpendicular to the first direction.

11. The converter according to claim 10, wherein the electronic components include an inductor and a transformer.

12. The converter according to claim 10, wherein the heat transfer layer includes a first heat transfer layer disposed at a lower portion of the printed circuit board and a second heat transfer layer disposed between the cover and the electronic components.

* * * * *